United States Patent

Furukawa

[11] Patent Number: 5,800,968
[45] Date of Patent: Sep. 1, 1998

[54] METHOD FOR HEAT DEVELOPING PHOTOSENSITIVE MATERIAL AND APPARATUS THEREFOR

[75] Inventor: Koji Furukawa, Shizuoka, Japan

[73] Assignee: Fuji Photo Film Co., Ltd., Kanagawa, Japan

[21] Appl. No.: 728,075

[22] Filed: Oct. 9, 1996

[30] Foreign Application Priority Data

Oct. 9, 1995 [JP] Japan .................................. 7-261624

[51] Int. Cl.$^6$ .................................................. G03C 5/16
[52] U.S. Cl. ................................. 430/350; 430/203
[58] Field of Search ................................. 430/203, 350, 430/330, 202, 205

[56] References Cited

U.S. PATENT DOCUMENTS 4,985,339   1/1991   Koizumi et al. .
5,122,443   6/1992   Takeda .
5,290,659   3/1994   Takeda .

*Primary Examiner*—Thorl Chea
*Attorney, Agent, or Firm*—Sughrue, Mion, Zinn, Macpeak & Seas, PLLC

[57] ABSTRACT

Provided are a method for heat developing a photosensitive material comprising the steps of heating the surface of the photosensitive material at a first temperature at which decarboxylation and release of a base by decomposition of a base precursor proceed, the surface being exposed to an atmosphere in a non-contact state, and then heating the photosensitive material at a second temperature which a hardening reaction proceeds at and is higher than the first temperature; and an apparatus comprising a non-contact heating section for heating the photosensitive material in the non-contact state at the first temperature and a contact heating section for heating the photosensitive material in a contact state at the second temperature. The method and apparatus efficiently liberate from the photosensitive material carbonic acid gas generated by decomposition of the base precursor to make smooth progress of the heat development reaction possible.

2 Claims, 3 Drawing Sheets

METHOD FOR HEAT DEVELOPING PHOTOSENSITIVE MATERIAL AND APPARATUS THEREFOR

FIELD OF THE INVENTION

The present invention relates to a method for heat developing a photosensitive material and an apparatus therefor, and particularly to a method for heat developing a printing plate and an apparatus therefor.

BACKGROUND OF THE INVENTION

Previously, so-called heat development in which latent images produced by exposure are developed by heating has been applied to some printing plates.

Such printing plates, which utilize hardening reaction using a silver halide as a photosensor, are disclosed in JP-A64-17047 (which corresponds to U.S. Pat. No. 4,985,339 and European Patent 0298522B), JP-A-5-249667 (which corresponds to U.S. Pat. No. 5,122,443 and European Patent 042692B) and JP-A-4-191856 (which corresponds to U.S. Pat. No. 5,290,659). The term "JP-A" as used herein means an "unexamined published Japanese patent application". FIG. 3 shows the structure and reaction thereof schematically.

As shown in FIG. 3, the above-mentioned printing plate is constituted as a photosensitive material using the silver halide as a photosensor, which comprises a support laminated in sequence with a hardenable layer 72 containing at least one of a polymerizable compound and a crosslinkable polymer, a photosensitive layer 71 containing a silver halide 74 and a reducing agent 90, and an overcoat layer 91 containing a base precursor 75 to prevent entrance of oxygen contained in air. As the support used herein, an aluminum support is preferably used. The base precursor 75 is decarboxylated by heating to release a base.

Based on FIG. 3, the principle of heat development of this photosensitive material is described. First, in the exposure process, the photosensitive layer 71 is irradiated with a light beam 73, and the silver halide 74 contained in the photosensitive layer 71 is exposed to form a latent image. Then, the overcoat layer 91, photosensitive layer 71 and the hardenable layer 72 are heated in the development process.

In the development process, the base precursor 75 is thermally decomposed by application of heat 76 to the overcoat layer 91. The base precursor 75 releases carbonic acid gas 78 to become the base 79 by this decomposition process 77. The base 79 is diffused in the diffusion process 80 under heating to activate the reducing agent 90. The activated reducing agent 90 is reacted with the exposed silver halide 74 on which the latent image is formed, and itself becomes an oxidized product 81. The oxidized product 81 is further decomposed to form a radical 82, which polymerizes the monomer 92 contained in the hardenable layer 72 or crosslinks the crosslinkable polymer 83 to harden it, thereby forming a polymer image. Thus, heat development is completed.

Then, if the surface of the photosensitive material is not exposed in the above-mentioned heat development processing, the carbonic acid gas 78 generated on thermal decomposition of the base precursor 75 in the decomposition process 77 has its escape cut off, resulting in destruction of an interface between the photosensitive layer 71 and the hardenable layer 72. Such destruction of the interface between the photosensitive layer 71 and the hardenable layer 72 inhibits diffusion of the radical 82, which hinders formation of the polymer image.

On the other hand, in heat development, a process of heating a photosensitive material in contact with a heating plate or the like is employed in order to precisely heat the photosensitive material, and the photosensitive material is weakly pressed from the surface thereof with a belt member or the like to bring the back of the aluminum support into good contact with the heating plate or the like.

For this reason, when the surface of the photosensitive material is covered with the belt member, effective release of the generated carbonic acid gas 78 from the overcoat layer 91 is inhibited, resulting in destruction of the interface between the photosensitive layer 71 and the hardenable layer 72, which hinders progress of the heat development reaction.

SUMMARY OF THE INVENTION

The present invention has been made for solving such a problem of the conventional heat development process. An object of the present invention is to provide a method and an apparatus for heat developing a photosensitive material, which efficiently liberates therefrom carbonic acid gas generated by decomposition of a base precursor to make smooth progress of the heat development reaction possible.

In order to solve the above-mentioned problem, according to the present invention, there is provided a method for image exposing and heat developing a photosensitive material to form a hardened image, the photosensitive material comprising a support having provided thereon a silver halide, a reducing agent, a base precursor, and at least one of a polymerizable compound and a crosslinkable polymer in at least one layer, the base precursor being decarboxylated by heating to release a base, in which the heat development comprises the steps of:

heating the surface of the photosensitive material at a first predetermined temperature at which decarboxylation and release of the base by decomposition of the base precursor proceed, the surface being exposed to an atmosphere in a non-contact state, and heating the photosensitive material at a second predetermined temperature which a hardening reaction proceeds at and is higher than the first temperature.

Further, the present invention provides an apparatus for heat developing a photosensitive material comprising a support having provided thereon a silver halide, a reducing agent, a base precursor, and at least one of a polymerizable compound and a crosslinkable polymer in at least one layer, the base precursor being decarboxylated by heating to release a base, in which the heating section for heating the photosensitive material comprises:

a non-contact heating section for heating the surface of the photosensitive material at a first predetermined temperature at which decarboxylation and release of the base by decomposition of the base precursor proceed, the surface being exposed to an atmosphere in a non-contact state, and a contact heating section for heating the photosensitive material in a contact state at a second predetermined temperature which a hardening reaction proceeds at and is higher than the first temperature, the contact heating section being disposed downstream from the non-contact heating section.

The silver halide, the reducing agent, the base precursor, the polymerizable compound, and the crosslinkable polymer may be incorporated in one layer or separate layers of the photosensitive material.

According to the heat developing method of the present invention, the surface of the photosensitive material is exposed to the atmosphere in the non-contact state, and heated to the first temperature at which decarboxylation and release of the base by the decomposition reaction of the base precursor contained in an overcoat layer proceed. Accordingly, the carbonic acid gas generated by the decomposition reaction can be liberated from the surface of the overcoat layer exposed to the atmosphere in the non-contact state to prevent destruction of an interface between a photosensitive layer and a hardenable layer due to the generated carbonic acid gas.

On heating the photosensitive material to the second temperature after this decomposition reaction and the liberation of the carbonic acid gas, the base is diffused from the overcoat layer to the photosensitive layer, and development of the silver halide and the hardening reaction effectively proceed.

Further, according to the heat developing apparatus of the present invention, the heating section for heating the photosensitive material comprises the non-contact heating section for heating the surface of the photosensitive material in non-contact therewith to the first temperature, and the contact heating section for heating the photosensitive material in contact therewith to the second temperature at which the base is diffused. Accordingly, the decomposition reaction of the base precursor and diffusion of the generated carbonic acid gas are effectively performed during heating in the non-contact heating section, and the heat development reaction is effectively conducted during heating in the subsequent contact heating section.

DETAILED DESCRIPTION OF THE INVENTION

Embodiments of the present invention are described below.

The heat developing method according to the present invention can be applied to a photosensitive material utilizing the hardening reaction using the silver halide as a photosensor, for example, the photosensitive material which comprises an aluminum support laminated in sequence with a hardenable layer containing at least one of a polymerizable compound and a crosslinkable polymer, a photosensitive layer containing at least a silver halide, and an overcoat layer containing at least a base precursor which is decarboxylated by heating to release a base, either of the three layers containing a reducing agent. Such photosensitive materials are described in detail in JP-A-64-17047 (which corresponds to U.S. Pat. No. 4,985,339 and European Patent 0298522B), JP-A-5-249667 (which corresponds to U.S. Pat. No. 5,122,443 and European Patent 042692B) and JP-A-4-191856 (which corresponds to U.S. Pat. No. 5,290,659). First, the surface of the photosensitive material is exposed to the atmosphere in the non-contact state, and heated at the first predetermined temperature at which decarboxylation and release of the base by the decomposition reaction of the base precursor contained in the overcoat layer proceed. The carbonic acid gas generated by the decomposition reaction can be liberated thereby from the surface of the photosensitive material exposed to the atmosphere in the non-contact state to prevent destruction of an interface between the photosensitive layer and the hardenable layer which may be caused by the generated carbonic acid gas.

Thereafter, the photosensitive material is heated to the second predetermined temperature at which the released base is diffused. This second temperature is higher than the first temperature. The base is diffused by heating at the second temperature from the overcoat layer to the photosensitive layer, and development of the silver halide and the heat development reaction effectively proceed.

In heating of the photosensitive material to the second temperature, it is preferred to heat the photosensitive material while being weakly pressed to bring the back of the aluminum support into good contact with the heating plate.

Figure 1:
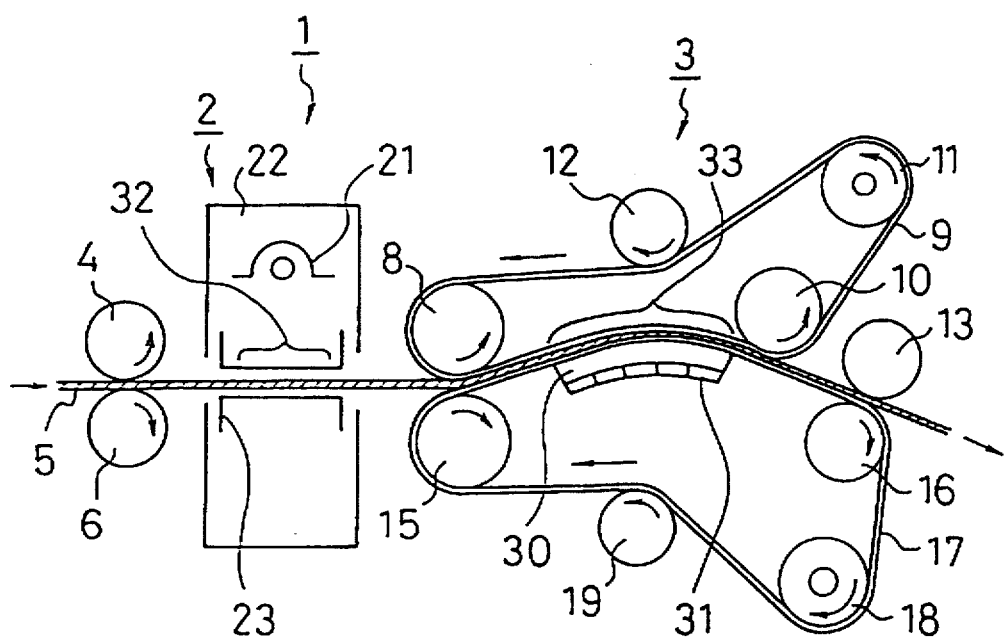
FIG. 1 is a schematic side view showing a heat developing apparatus embodying the present invention.

FIG. 1 is a schematic side view showing a heat developing apparatus embodying the present invention.

As shown in FIG. 1, the heat developing apparatus 1 according to the present invention is applied to the photosensitive material 5 utilizing the hardening reaction using the silver halide as a photosensor, which comprises an aluminum support laminated in sequence with a hardenable layer containing at least one of a polymerizable compound and a crosslinkable polymer, a photosensitive layer containing at least a silver halide, and an overcoat layer containing at least a base precursor which is decarboxylated by heating to release a base, either layer containing a reducing agent.

The heat developing apparatus 1 is provided with an infrared heater section 2 and a plate heater section 3 as the heating sections for heating the photosensitive material 5, the plate heater section 3 having a heating medium 30 having a convex circular arc-like surface to be heated by a plate heater 31. The heat developing apparatus 1 is further provided with a pair of carrying-in rollers 4 and 6 for pinching the photosensitive material 5 to carry it in the apparatus, a second belt 17 intervening between the surface of the heating medium 30 and the photosensitive material 5, a first belt 9 for pressing the photosensitive material 5 to the surface of the heating medium 30 through the second belt 17 in contact with the surface of the photosensitive material 5, and a carrying-out roller 13 for carrying out the heat-treated photosensitive material 5.

The second belt 17 is an endless belt, and driven with 4 rollers disposed below the heating medium 30, namely a driving roller 18, a tension roller 19, a carrying driven roller 15 and a carrying driven roller 16, in the direction indicated by the arrow. The carrying driven roller 15 is disposed on the carrying-in side (on the side of the infrared heater section 2) from the heating medium 30, and the carrying driven roller 16 is disposed on the carrying-out side from the heating medium 30.

As a result, the second belt 17 is in contact with the surface of the heating medium 30 over its entire length at an inner surface thereof, and moves while being pressed to the surface of the heating medium 30 in movement. The above-mentioned carrying-out roller 13 and the carrying driven roller 16 pinch the heat-treated photosensitive material 5, and carry out it.

The first belt 9 is an endless belt, and driven with 4 rollers disposed above the heating medium 30, namely a driving roller 11, a tension roller 12, a pressure driven roller 8 and a pressure driven roller 10, in the direction indicated by the arrow.

The pressure driven roller 8 is disposed on the carrying-in side (on the side of the infrared heater section 2) from the heating medium 30, and the pressure driven roller 10 is disposed on the carrying-out side from the heating medium 30.

As a result, the first belt 9 is in contact with the surface of the heating medium 30 over its entire length through the second belt 17 at an outer surface thereof, and moves with the second belt 17 moving while being pressed to the surface of the heating medium 30 and the photosensitive material 5 moving in contact with the surface of the second belt 17 at a lower surface thereof pressed from above.

The infrared heater section 2 is provided with an opening through which the photosensitive material 5 is carried in by pinching it between the carrying-in rollers 4 and 6, at the central portion of a case covered with a heat insulating material 22, and heat emitted from an infrared heater 21 disposed above inside the case heats the photosensitive material 5 passing therethrough at the first temperature. The first temperature is a predetermined temperature at which the base precursor contained in the overcoat layer decomposes to release carbonic acid gas and a base.

Wire guides 23 come into contact with only part of the photosensitive material 5 to guide the photosensitive material 5, but most part of the photosensitive material is in the non-contact state during passage thereof through the infrared heater section 2. The photosensitive material 5 is therefore heated at the first temperature with the surface thereof exposed to the atmosphere. A heating area in the infrared heating section 2 is an open heating area 32 heating the photosensitive material in the non-contact state to the first temperature. Thus, the infrared heating section 2 functions as the non-contact heating section.

The heating medium 30 of the plate heater section 3 is heated at the second temperature by the plate heater, and transmits heat to the photosensitive material 5 through the second belt 17 in contact with the surface thereof. The second temperature is higher than the first temperature, and a predetermined temperature at which the released base in the overcoat layer is diffused.

As described above, the photosensitive material 5 is pressed by the first belt 9 from above to below, namely to the side of the heating medium 30, so that it is heated under pressure in the contact state during passage thereof on the surface of the heating medium 30. An area of this heating medium 30 is a pressure heating area 33, and therefore, the plate heater section 3 functions as the contact heating section.

In the case of the above-mentioned photosensitive material, it is preferred that the first temperature is set within the range from 50° C. to 100° C., the second temperature is set within the range from 100° C. to 200° C. and the second temperature is set to a temperature higher than the first temperature. For instance, the first temperature and second temperature can be set to 120° C. and 155° C., respectively.

Further, as described above, the non-contact heating section is preferably constituted by an infrared or far infrared heater, and the contact heating section requiring higher accuracy is preferably constituted by a belt pressure type plate heater.

Then, the operation thereof will be described.

Figure 3:
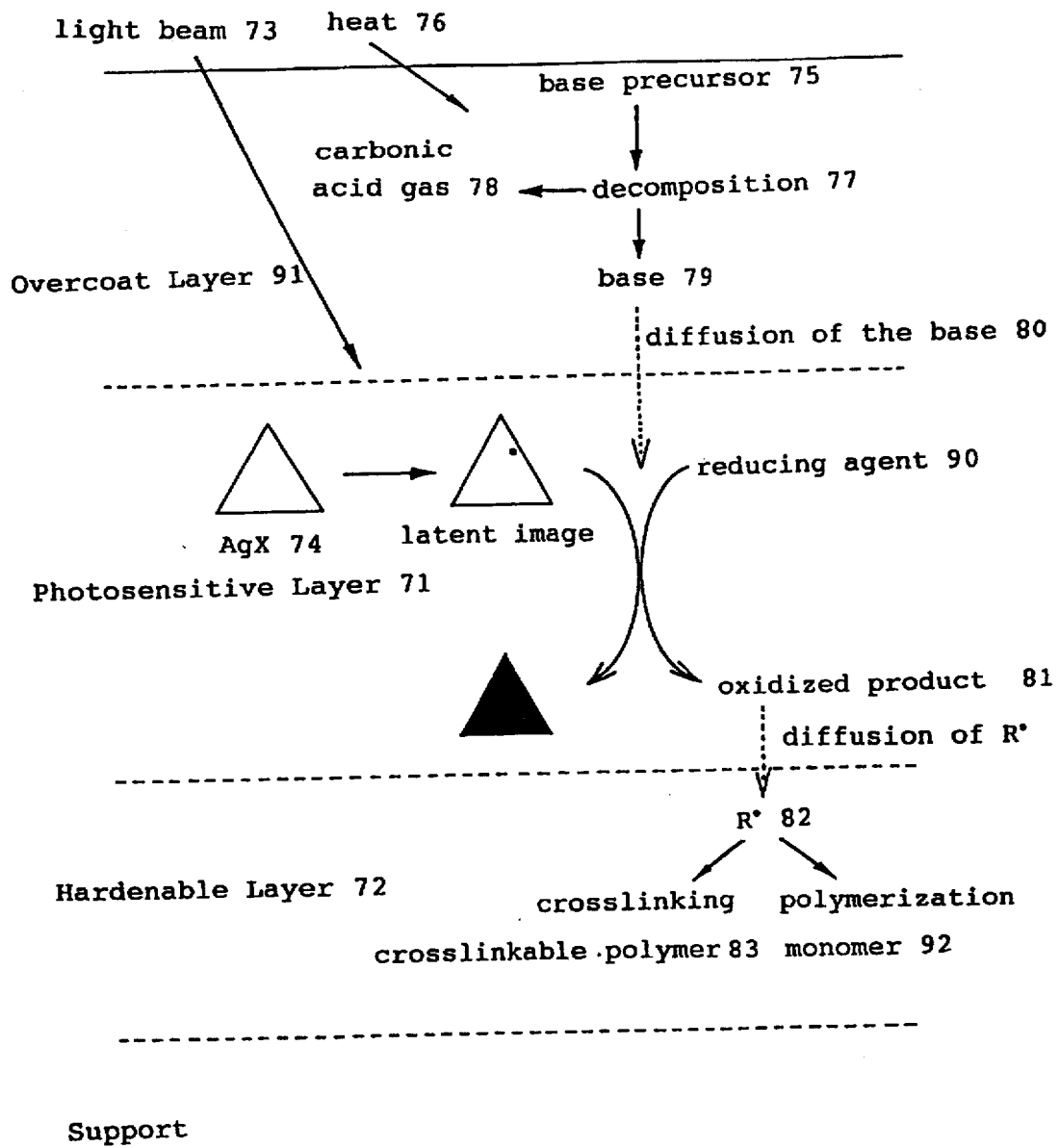
FIG. 3 is a schematic view for illustrating the principle of heat development of a photosensitive material.

When the photosensitive material 5 is heated in the non-contact state at the first temperature in the open heating area 32 of the infrared heater section 2, the decomposition reaction of the base precursor takes place in the overcoat layer of the photosensitive material 5 to generate a base and carbonic acid gas (see FIG. 3). However, the surface of the photosensitive material is exposed to the atmosphere in the non-contact state, so that carbonic acid gas is rapidly liberated to the atmosphere without destruction of the interface between the photosensitive layer and the hardenable layer.

When the photosensitive material 5 is then moved to the plate heater section 3 and brought into contact with the heating medium 30 through the second belt 17 by the first belt 9 in the pressure heating area 33 to heat it under pressure at the second temperature, the base in the overcoat layer of the photosensitive material 5 is diffused and reaches the photosensitive layer. When the base activates the reducing agent to reduce a latent image portion of the silver halide, the reducing agent is oxidized to an oxidized product, further to a radical, which polymerizes the monomer or crosslinks the crosslinkable polymer contained in the hardenable layer, thereby forming a polymer image. Thus, in the heat developing apparatus according to the present invention, the base precursor is decomposed in the open heating area 32, and the carbonic acid gas is liberated. Then, the base is diffused in the pressure heating area 33 to promote development of the silver halide and the heat development reaction.

After heat development, the resulting image is post-treated by virtue of the differences in chemical or physical properties (for example, solubility, surface adhesion, adhesive strength with the support, softening point, refraction, dielectric constant, diffusibility and coloring properties) between the hardened area and the unhardened area.

The post-treatments include elution (etching) treatment, removal treatment (with a sheet), transfer treatment, toner development treatment and dying treatment. Each treatment is described below. These treatments may be arbitrarily combined to conduct them.

Elution (Etching) Treatment

In elution treatment, only an unhardened area is eluted by virtue of the difference in solubility between the unhardened area and the hardened area to form a polymer image.

In general, after heat treatment, the photosensitive material is immersed in a liquid (an etching solution) which can remove the unhardened area of the hardenable layer. Liquids (such as an organic solvent, an alkaline aqueous solution and a mixture thereof) which are capable of dissolving or swelling the unhardened hardenable layer are used as the etching solution. Examples of the alkaline compound include potassium hydroxide, sodium hydroxide, potassium silicate, sodium silicate, potassium metasilicate, sodium metasilicate, potassium phosphate, sodium phosphate, ammonia and amino alcohols (for example, monoethanolamine, diethanolamine and triethanolamine). Various organic solvents may be added to the etching solution mainly composed of water, if necessary. Examples of the organic solvent include a lower alcohol (for example, methanol, ethanol, propanol and butanol), an aromatic ring-containing alcohol (for example, benzyl alcohol and phenetyl alcohol), ethylene glycol, diethylene glycol, triethylene glycol, polyethylene glycol, cellosolves, and the amino alcohols described above as the bases. The etching solution may further contain surfactants, defoaming agents and other additives if necessary. The commercially available developing solutions for printing plates can also be used. The heat-developed photosensitive material may be directly immersed in the etching solution, but may be immersed therein after the layers other than the hardenable layer (e.g., the photosensitive layer) are removed by washing or separation.

Removal Treatment (with Sheet)

An unhardened area or a hardened area is selectively adhered to another sheet (a removing sheet) by making use of the difference in adhesive strength with a support between the unhardened area and the hardened area, thereby removing the unhardened area or the hardened area. The area thus remained on the photosensitive material is utilized as an image. The photosensitive material may be laminated with the removing sheet before image exposure or before development.

Transfer Treatment

An unhardened area or a hardened area is selectively adhered to another sheet (an image receiving sheet) by making use of the difference in adhesive strength with a support between the unhardened area and the hardened area, thereby transferring the unhardened area or the hardened area. The area thus transferred to the image receiving sheet is utilized as an image. The photosensitive material may be laminated with the image receiving sheet before image exposure or before development.

Toner Development Treatment

A coloring material (a toner) is selectively adhered to an unhardened area or a hardened area, thereby making an image visible. By virtue of the difference in surface adhesion between the unhardened area and the hardened area, the toner can be adhered to the unhardened area. After the unhardened area or the hardened area is selectively removed, the toner may be added to the remaining area. The photosensitive material can comprise an adhesive layer, and the unhardened area or the hardened area can be selectively removed, followed by adhesion of the toner to the exposed adhesive layer. Further, toner development treatment can also be applied to the image receiving material to which the unhardened area or the hardened area is selectively transferred.

Dying Treatment

An unhardened area or a hardened area is selectively dyed, thereby making an image visible. Dying treatment may also be applied to the image receiving material to which the unhardened area or the hardened area is selectively transferred.

The images obtained as described above can be used in printing plates, color proofs, hard copies, reliefs, etc.

Figure 2:
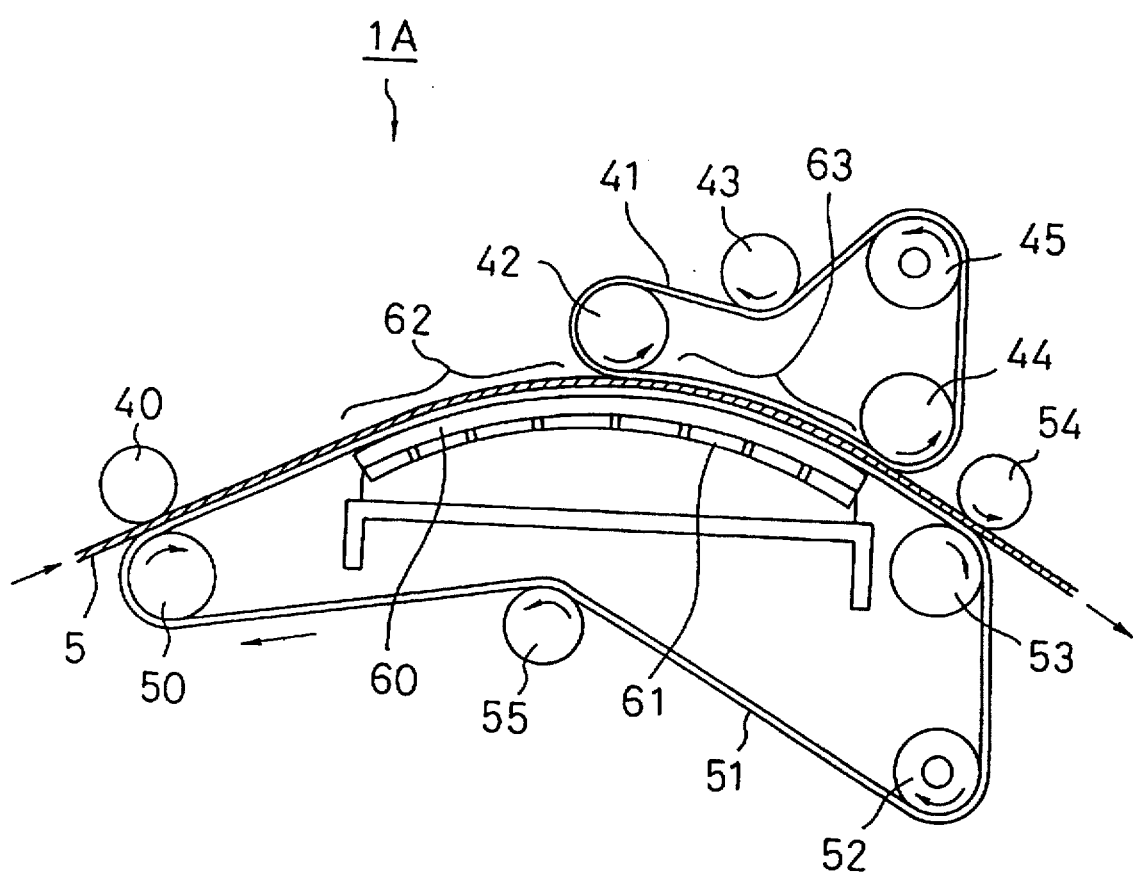
FIG. 2 is a schematic side view showing another heat developing apparatus embodying the present invention.

FIG. 2 is a schematic side view for illustrating another embodiment of a heat developing apparatus of the present invention.

As shown in FIG. 2, a heat developing apparatus 1A is provided with a heating medium 60 having a convex circular arc-like surface and heated by a plate heater 61. The heat developing apparatus 1A is further provided with a carrying-in roller 40 for pinching the photosensitive material 5 to carry it in the apparatus, a carrying belt 51 intervening between the surface of the heating medium 60 and the photosensitive material 5, a pressure belt 41 for pressing the photosensitive material 5 to the surface of the heating medium 60 through the carrying belt 51 in contact with the surface of the photosensitive material 5, and a carrying-out roller 54 for carrying out the heat-treated photosensitive material 5.

The carrying belt 51 is an endless belt, and driven with 4 rollers disposed below the heating medium 60, namely a driving roller 52, a tension roller 55, a carrying driven roller 50 and a carrying driven roller 53, in the direction indicated by the arrow. As a result, the carrying belt 51 moves from the carrying-in direction to the carrying-out direction while being pressed on the surface of the heating medium 60 when it moves on the heating medium 60.

The carrying driven roller 50 is disposed on the carrying-in side from the heating medium 60, and the carrying driven roller 53 is disposed on the carrying-out side from the heating medium 60.

As a result, the carrying belt 51 is in contact with the surface of the heating medium 60 over its entire length at an inner surface thereof, and moves while being pressed to the surface of the heating medium 60.

The above-mentioned carrying-in roller 45 and the carrying driven roller 50 pinch the photosensitive material 5 prior to heat treatment, and carry it in the apparatus. The carrying-out roller 54 and the carrying driven roller 53 pinch the heat-treated photosensitive material 5, and carry out it.

The pressure belt 41 is an endless belt, and driven with 4 rollers disposed above the heating medium 60, namely a driving roller 45, a tension roller 43, a pressure driven roller 42 and a pressure outlet roller 44, in the direction indicated by the arrow.

The pressure driven roller 42 is disposed at an approximately central portion above the heating medium 60, and is in non-contact with the heating medium 60 through the pressure belt 41 and the carrying belt 51. On the other hand, the pressure outlet roller 44 is disposed on the carrying-out side from the end of the heating medium 60 in the carrying-out direction.

As a result, the photosensitive material 5 placed on the carrying belt 51 to move is heated while moving from the left end (in the carrying-in direction) of the heating medium 60 to the central portion in contact with the heating medium 60. Because of the absence of the pressure belt 41 between them, the surface of the photosensitive material 5 is kept open in the atmosphere in the non-contact state. Hence, the area extending from the end of the heating medium 60 in the carrying-in direction to the central portion is an open heating area 62, and the temperature thereof is set to the first temperature.

Then, the photosensitive material 5 placed on the carrying belt 51 moves from the central portion of the heating medium 60 to the right end (in the carrying-out direction). The pressure belt 41 exists therebetween to press the photosensitive material 5, so that it is heated under pressure in the contact state. Accordingly, the area extending from the central portion of the heating medium 60 to the end thereof in the carrying-out direction is a pressure heating area 63, and the temperature thereof is set to the second temperature.

Then, the operation thereof will be described.

When the photosensitive material 5 is heated in the non-contact state at the first temperature in the open heating area 62, the decomposition reaction of the base precursor takes place in the overcoat layer of the photosensitive material 5 to generate a base and carbonic acid gas (see FIG. 3). However, the surface of the overcoat layer is exposed to the atmosphere in the non-contact state, so that the carbonic acid gas is rapidly liberated to the atmosphere without destruction of the interface between the photosensitive layer and the hardenable layer.

When the photosensitive material 5 is then brought into contact with the heating medium 60 through the carrying belt 51 by the pressure belt 41 in the pressure heating area 63 to heat it under pressure at the second temperature, the base in the overcoat layer of the photosensitive material 5 is diffused and reaches the photosensitive layer. When the base activates the reducing agent to reduce a latent image portion of the silver halide, the reducing agent is oxidized to an oxidized product, further to a radical, which polymerizes the monomer or crosslinks the crosslinkable polymer contained in the hardenable layer, thereby forming a polymer image. Thus, in the heat developing apparatus 1A according to the present invention, the heating medium 60 is partly assigned to the open heating area 62, in which the base precursor is decomposed and the carbonic acid gas is liberated. Then, another part of the heating medium 60 is assigned to the pressure heating area 63, in which the base is diffused to promote development of the silver halide and the heat development reaction.

The subsequent treatments are the same as in the first embodiment.

As described above, in the method and the apparatus for heat developing the photosensitive material according to the present invention, the surface of the photosensitive material is heated at the first temperature at which the decomposition reaction of the base precursor proceed, while being exposed in the non-contact state, and then the photosensitive material is heated to the second temperature higher than the first temperature. Accordingly, the carbonic acid gas generated by decomposition of the base precursor can be efficiently liberated from the photosensitive material to make smooth progress of the heat development reaction possible without destruction of the interface between the photosensitive layer and the hardenable layer, which can realize development of a good polymer image.

While the invention has been described in detail with reference to specific embodiments, it will be apparent to one skilled in the art that various changes and modifications can be made to the invention without departing from its spirit and scope.

What is claimed is:

1. A method for image exposing and heat developing a photosensitive material to form a hardened image, the photosensitive material comprising a support having provided thereon a silver halide, a reducing agent, a base precursor, and at least one of a polymerizable compound and a crosslinkable polymer in at least one layer, the base precursor being decarboxylated by heating to release a base, in which the heat development comprises the steps of:

(1) heating the surface of the photosensitive material at a first predetermined temperature at which decarboxylation and release of the base by decomposition of the base precursor proceed, the surface being exposed to an atmosphere in a non-contact state to liberate carbonic acid gas, and (2) contact heating the photosensitive material in a contact state at a second predetermined temperature which a hardening reaction proceeds at and is higher than the first temperature.

2. The method as claimed in claim 1, wherein the photosensitive material comprises the support laminated in sequence with at least a hardenable layer containing at least one of the polymerizable compound and the crosslinkable polymer, a photosensitive layer containing the silver halide, and an overcoat layer containing the base precursor, either layer containing the reducing agent.

* * * * *